United States Patent [19]
Chan et al.

[11] Patent Number: 5,618,384
[45] Date of Patent: Apr. 8, 1997

[54] METHOD FOR FORMING RESIDUE FREE PATTERNED CONDUCTOR LAYERS UPON HIGH STEP HEIGHT INTEGRATED CIRCUIT SUBSTRATES USING REFLOW OF PHOTORESIST

[75] Inventors: Lap Chan; Met S. Zhou, both of Singapore, Singapore

[73] Assignee: Chartered Semiconductor Manufacturing Pte, Ltd., Singapore, Singapore

[21] Appl. No.: 579,165

[22] Filed: Dec. 27, 1995

[51] Int. Cl.⁶ .................................................. C23F 1/00
[52] U.S. Cl. ........................ 438/669; 216/41; 216/46; 438/694; 438/704; 438/948
[58] Field of Search .................... 156/659.11, 656.1; 216/11, 41, 46, 49, 56, 75, 100; 437/228, 229, 245, 982

[56] References Cited

U.S. PATENT DOCUMENTS

| | | | |
|---|---|---|---|
| 4,795,718 | 1/1989 | Beitman | 437/41 |
| 4,981,809 | 1/1991 | Mitsuaki et al. | 437/41 |
| 5,007,984 | 4/1991 | Tsutsumi et al. | 216/41 |
| 5,231,051 | 7/1993 | Baldi et al. | 437/192 |
| 5,238,872 | 8/1993 | Thalapaneni | 437/192 |
| 5,371,025 | 12/1994 | Sung | 437/41 |
| 5,395,781 | 3/1995 | Wilhoit | 437/44 |
| 5,403,435 | 4/1995 | Cathey et al. | 437/245 |
| 5,505,322 | 4/1996 | Shinohara et al. | 156/656.1 |

FOREIGN PATENT DOCUMENTS

| | | | |
|---|---|---|---|
| 021931A1 | 1/1981 | European Pat. Off. | 437/982 |
| 2929077 | 2/1981 | Germany | 437/982 |
| 58-106847A | 6/1983 | Japan | 437/982 |
| 3-81734 | 4/1991 | Japan | 216/41 |
| 5-346589 | 12/1993 | Japan . | |

*Primary Examiner*—Robert Kunemund
*Assistant Examiner*—Anita Alanko
*Attorney, Agent, or Firm*—George O. Saile; Alek P. Szecsy

[57] ABSTRACT

A method for forming a residue free patterned conductor layer upon a high step height integrated circuit substrate. First, there is provided a semiconductor substrate having formed thereon a high step height patterned integrated circuit layer. Formed upon the high step height patterned integrated circuit layer is a blanket conductor layer, and formed upon the blanket conductor layer is a patterned photoresist layer. The portions of the blanket conductor layer exposed through the patterned photoresist layer are etched through an anisotropic etch process to leave remaining a patterned conductor layer upon the surface of the high step height patterned integrated circuit layer and conductor layer residues at a lower step level of the high step height patterned integrated circuit layer. The patterned photoresist layer is then reflowed to cover exposed edges of the patterned conductor layer. Finally, the conductor layer residues at the lower step level of the high step height patterned integrated circuit layer are removed through an isotropic etch process.

18 Claims, 5 Drawing Sheets

METHOD FOR FORMING RESIDUE FREE PATTERNED CONDUCTOR LAYERS UPON HIGH STEP HEIGHT INTEGRATED CIRCUIT SUBSTRATES USING REFLOW OF PHOTORESIST

BACKGROUND OF THE INVENTION

1. Field of the Invention

The present invention relates generally to methods for forming patterned conductor layers within integrated circuits. More particularly, the present invention relates to methods for forming residue free patterned conductor layers upon high step height integrated circuit substrates.

2. Description of the Related Art

As integrated circuit technology progresses towards increasingly higher levels of integration, conductor linewidths and conductor spacings within advanced integrated circuits have become increasingly smaller while the aspect ratios of those conductor lines have increased. In addition to characteristics which relate directly to the size and spacing of conductors within advanced integrated circuits, it is also common that conductors within advanced integrated circuits are formed upon substrate layers which have significant topographic variations such as substantial step height differentials. The sum of these factors often impedes production of fully functional and reliable patterned conductor layers within advanced integrated circuits.

One of the more common defects which occurs when photolithographically forming patterned conductor layers upon high step height integrated circuit substrates is the simultaneous formation of undesirable conductor layer residues at lower step levels within those integrated circuits. The undesirable conductor layer residues are typically formed at the lower step levels of the integrated circuit through incomplete etching of the blanket conductor layers from which are formed the patterned conductor layers. The presence of conductor layer residues at lower step levels within high step height integrated circuits may lead to electrical shorts and bridging within advanced integrated circuits.

Although it is possible to remove conductor layer residues from lower step levels through a more vigorous etching of the blanket conductor layer from which is simultaneously formed the patterned conductor layer and the conductor layer residues, such additional etching will typically substantially erode or otherwise damage the edges of the patterned conductor layer exposed beneath a photoresist etch mask while simultaneously removing the conductor layer residues. Thus, the present invention is directed towards the goal of removing undesired conductor layer residues from lower step levels within high step height integrated circuits while simultaneously maintaining the integrity of the patterned conductor layers which are formed simultaneously with the conductor layer residues.

Methods through which patterned features within integrated circuits may be protected from deterioration due to exposure to integrated circuit processing operations are known in the art. For example, Beitman, in U.S. Pat. No. 4,795,718 discloses a method for manufacturing an Insulated Gate Field Effect Transistor (IGFET) having self-aligned source/drain contact regions. The method employs forming a low melting point dielectric layer over the gate electrode of the IGFET device and heating the dielectric until it covers and encapsulates the gate electrode of the IGFET. The self-aligned source/drain contacts may then be formed without shorting to the gate electrode.

Although not directed towards the goal of encapsulating delicate integrated circuit features, Mitsuaki et al., in U.S. Pat. No. 4,981,809 describe a related method for forming fine mask patterns for use in producing advanced transistors. The method employs a patterned photoresist layer formed and subsequently annealed upon a semiconductor substrate. The annealing process reflows the patterned photoresist layer and forms smaller openings within the photoresist pattern. The smaller openings yield a fine mask pattern which is useful in forming advanced transistors.

Finally, Sung, in U.S. Pat. No. 5,371,025 describes a method for making Thin Film Transistors (TFTs) for use within Liquid Crystal Displays (LCDs). The method employs a patterned photoresist layer formed upon a gate electrode, which patterned photoresist layer is subsequently thermally re-flowed to form a mask which prevents channel overlap between the gate electrode and the source/drain electrodes of the Thin Film Transistor (TFT). Thin Film Transistors (TFTs) which have limited channel overlap exhibit a higher signal to noise ratio. Thus, they produce higher quality Liquid Crystal Displays (LCDs).

Desirable in the art is a method analogous to the above disclosed methods whereby thermal reflow properties of integrated circuit fabrication materials may be employed to assist in removing from high step height integrated circuits upon which have been formed patterned conductor layers conductor residue layers which are simultaneously formed upon lower step levels of those integrated circuits.

SUMMARY OF THE INVENTION

A first object of the present invention is to provide a method for forming residue free patterned conductor layers upon high step height integrated circuit substrates, while simultaneously maintaining the integrity of the patterned conductor layers.

A second object of the present invention is to provide a method in accord with the first object of the present invention, which method is also manufacturable.

A third object of the present invention is to provide a method in accord with the first object of the present invention and the second object of the present invention which method is also economical.

In accord with the objects of the present invention, a new method for providing a residue free patterned conductor layer upon a high step height integrated circuit substrate is provided. To practice the method of the present invention, there is first provided a high step height integrated circuit substrate. Upon the high step height integrated circuit substrate is formed a blanket conductor layer, and upon the blanket conductor layer is formed a patterned photoresist layer. By means of an anisotropic etch, the portions of the blanket conductor layer exposed through the patterned photoresist layer are etched to leave remaining a patterned conductor layer and undesired conductor residue layers. The undesired conductor residue layers reside at lower step levels of the high step height integrated circuit substrate. The patterned photoresist layer is then reflowed to cover exposed edges of the patterned conductor layer. Finally, the conductor layer residues within the lower step levels of the high step height integrated circuit substrate are removed through an isotropic etch process.

The method of the present invention provides residue free patterned conductor layers upon high step height integrated circuit substrates, while simultaneously maintaining the integrity of those patterned conductor layers. The method of the present invention provides a patterned photoresist layer, which after having been employed as an etch mask for anisotropic etching of a blanket conductor layer into a patterned conductor layer (upon a high step height integrated circuit substrate) and conductor layer residues (within lower step levels of the high step height integrated circuit substrate) is reflowed to cover the edges of the patterned conductor layer exposed beneath the patterned photoresist layer. After the exposed edges of the patterned conductor layer have been covered with the reflowed patterned photoresist layer, undesired conductor layer residues are removed through an isotropic etch process. By reflowing the patterned photoresist layer to cover the exposed edges of the anisotropically etched patterned conductor layer, those exposed edges are protected from the isotropic etch process through which undesired conductor layer residues are removed from the lower step levels of the high step height integrated circuit substrate.

The method of the present invention is readily manufacturable. The method of the present invention requires only a thermal reflow process of the patterned photoresist layer after the patterned photoresist layer has been employed in forming the anisotropically etched patterned conductor layer and conductor layer residues. Methods through which patterned photoresist layers may be reflowed are well known in the art. Such methods are readily manufacturable.

The method of the present invention is economical. The process by which patterned photoresist layers may be reflowed to cover edges of patterned conductor layers exposed through those patterned photoresist layers are known in the art. In addition to being readily manufacturable, such methods are also economical.

BRIEF DESCRIPTION OF THE DRAWINGS

The following drawings, which form a material part of this disclosure, show the following.

DETAILED DESCRIPTION OF THE PREFERRED EMBODIMENTS

The present invention provides a method for forming a residue free patterned conductor layer upon a high step height integrated circuit substrate, while simultaneously preserving the integrity of that patterned conductor layer. The method of the present invention provides a patterned photoresist layer through which an underlying blanket conductor layer is patterned into a patterned conductor layer and conductor layer residues. After the patterned conductor layer and conductor layer residues are formed through an anisotropic etch process, the patterned photoresist layer is reflowed to cover the edges of the patterned conductor layer exposed beneath the patterned photoresist layer. After the exposed edges of the patterned conductor layer have been covered with the reflowed patterned photoresist layer, the conductor layer residues formed at lower step levels of the high step height integrated circuit substrate may be removed through an isotropic etch process.

The present invention may be practiced upon any high step height integrated circuit substrate of sufficiently high step height such that conductor layer residues are routinely formed when blanket conductor layers upon the high step height integrated circuit substrate are patterned into patterned conductor layers when employing an anisotropic etch process and a patterned photoresist etch mask. The method of the present invention may be employed in integrated circuits including but not limited to Static Random Access Memory (SRAM) integrated circuits, Dynamic Random Access Memory (DRAM) integrated circuits, Application Specific Integrated Circuits (ASICs), integrated circuits having within their fabrications field effect transistors and integrated circuits having within their constructions bipolar transistors. The method of the present invention has broad applicability within integrated circuit fabrication.

Figure 1A:
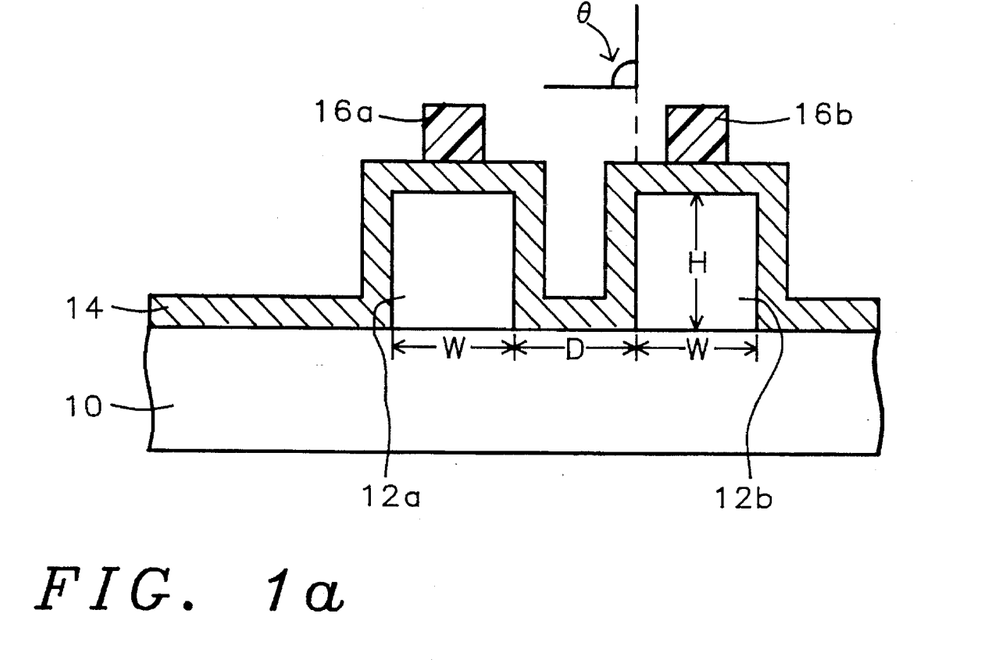
FIG. 1a to FIG. 1e show a series of cross-sectional schematic diagrams which illustrate progressive stages in forming the residue free patterned conductor layer of the first preferred embodiment of the present invention.

Referring now to FIG. 1a to FIG. 1e there is shown a series of cross-sectional schematic diagrams illustrating progressive stages in forming the residue free patterned conductor layer of the first preferred embodiment of the present invention. The first preferred embodiment of the present invention illustrates the general integrated circuit structure where a patterned conductor layer is formed upon the surface of a high step height integrated circuit substrate. Shown in FIG. 1a is a cross-sectional schematic diagram illustrating the high step height integrated circuit substrate at early stages of practice of the present invention.

Shown in FIG. 1a is a substrate layer 10, upon whose surface is formed a pair of high step height patterned integrated circuit layers 12a and 12b. The substrate layer 10 may be comprised of layers including but not limited to insulator layers; conductors layers; semiconductor layers; and, composites of insulator layers, conductor layers and semiconductor layers. Practice of the present invention provides most value when the step height, H, is substantial in comparison with conventional integrated circuits. Preferably, the step height, H, is at least about 1000 angstroms. Less significant in the practice of the present invention are the individual widths, W, of the high step height patterned integrated circuits layers 12a and 12b, and the distance, D, separating those layers. Typically the widths, W, of the high step height patterned integrated circuit layers 12a and 12b are greater than about 5000 angstroms each, and the distance, D, separating those layers is at least about 2000 angstroms.

The high step height patterned integrated circuit layers 12a and 12b may also be formed of integrated circuit layers including but not limited to conductor layers; insulator layers; semiconductor layers; and, composites of conductor layers, insulator layers and semiconductor layers. It is important in practice of the present invention that the substrate layer 10 and the high step height patterned integrated circuit layers 12a and 12b be formed of materials, or composites of materials, which have a low etch selectivity to the anisotropic and isotropic etch processes to which those layers will subsequently be exposed. It is also important to the present invention that the sidewalls of the high step height patterned integrated circuit layers 12a and 12b be substantially vertical, preferably with no undercutting, and preferably with angle $\Theta$, as illustrated in FIG. 1a, from about 85 to about 95 degrees with respect to the plane of the substrate layer.

Also shown in FIG. 1a is a blanket conductor layer 14. The blanket conductor layer 14 may be formed of several conductive materials, including but not limited to metals, metal alloys, metal silicides, metal nitrides, doped polysilicon and polycides (polysilicon/metal silicide stacks). The blanket conductor layer 14 may be deposited and formed through methods as are conventional in the art, including but not limited to thermal evaporation methods, Chemical Vapor Deposition (CVD) methods, Physical Vapor Deposition (PVD) sputtering methods, Plasma Enhanced Chemical Vapor Deposition (PECVD) methods and Rapid Thermal Annealing (RTA) methods. Typically, the thickness of the blanket conductor layer 14 is from about 200 to about 4000 angstroms.

Finally, there is shown in FIG. 1a the presence of patterned photoresist layers 16a and 16b. The patterned photoresist layers 16a and 16b may be formed from any of several photoresists including but not limited to novolak, Poly-Methyl-Meth-Acrylate (PMMA) and chemically amplifying photoresists. Analogously to the substrate layer 10 and the high step height patterned integrated circuit layers 12a and 12b, it is important to the present invention that the photoresist from which is formed the patterned photoresist layers 16a and 16b be a photoresist that is not susceptible to degradation through exposure to the anisotropic and isotropic etch processes through which the blanket conductor layer 14 will be etched. It is also important to the present invention that the patterned photoresist layers 16a and 16b be readily reflowable and that the patterned photoresist layers 16a and 16b be of sufficient thickness when reflowed to cover exposed edges of etched portions of the blanket conductor layer 14. Preferably, the patterned photoresist layers 16a and 16b are from about 4000 to about 30000 angstroms thick each.

Figure 1B:
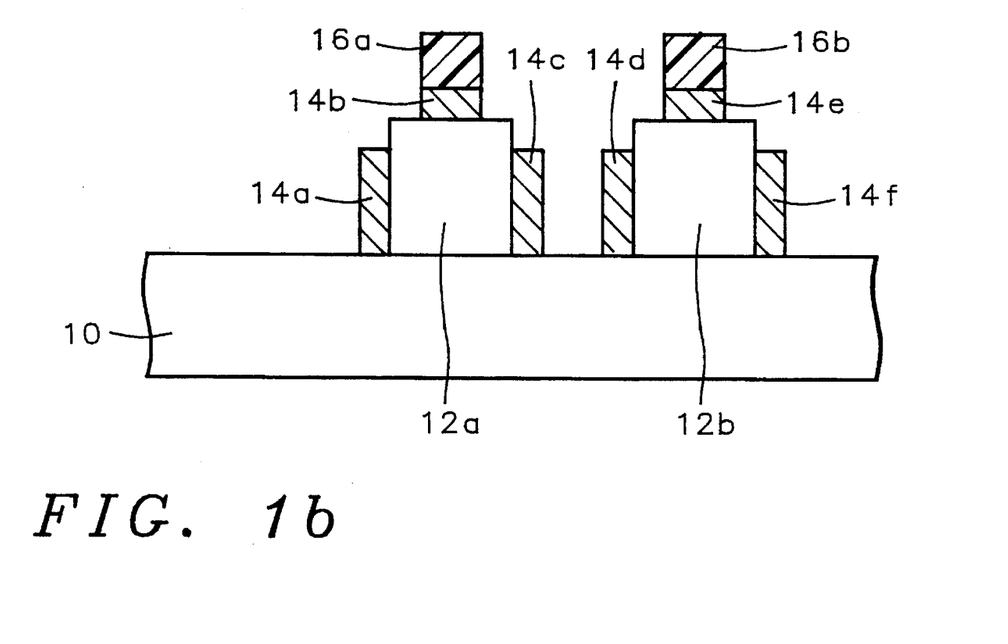

Referring now to FIG. 1b, there is shown a cross-sectional schematic diagram illustrating the results of the next process step in the first preferred embodiment of the present invention. Shown in FIG. 1b is the anisotropic etching of the blanket conductor layer 14 to leave remaining the patterned conductor layers 14b and 14e, and the undesired conductor layer residues 14a, 14c, 14d and 14f. The anisotropic etching may be undertaken through any anisotropic etch process which is appropriate to the blanket conductor layer 14. Typically, the anisotropic etch process will be an Reactive ion Etch (RIE) anisotropic etch process employing an etchant gas appropriate to the material from which is formed the blanket conductor layer 14.

The undesired conductor layer residues 14a, 14c, 14d and 14f result from the substantial vertical height of the blanket conductor layer 14 adjoining the sidewalls of the high step height patterned integrated circuit layers 12a and 12b. Although it is possible to remove the conductor layer residues 14a, 14c, 14d and 14f through continued anisotropic etching of those residues, the exposed edges of the patterned conductor layers 14b and 14e will typically be eroded or otherwise deteriorated under continued anisotropic etching conditions. If allowed to remain within the integrated circuit within which they are formed, the conductor layer residues 14a, 14c, 14d and 14f provide conductive pathways and bridges which manifest as functionality or reliability defects.

Figure 1C:
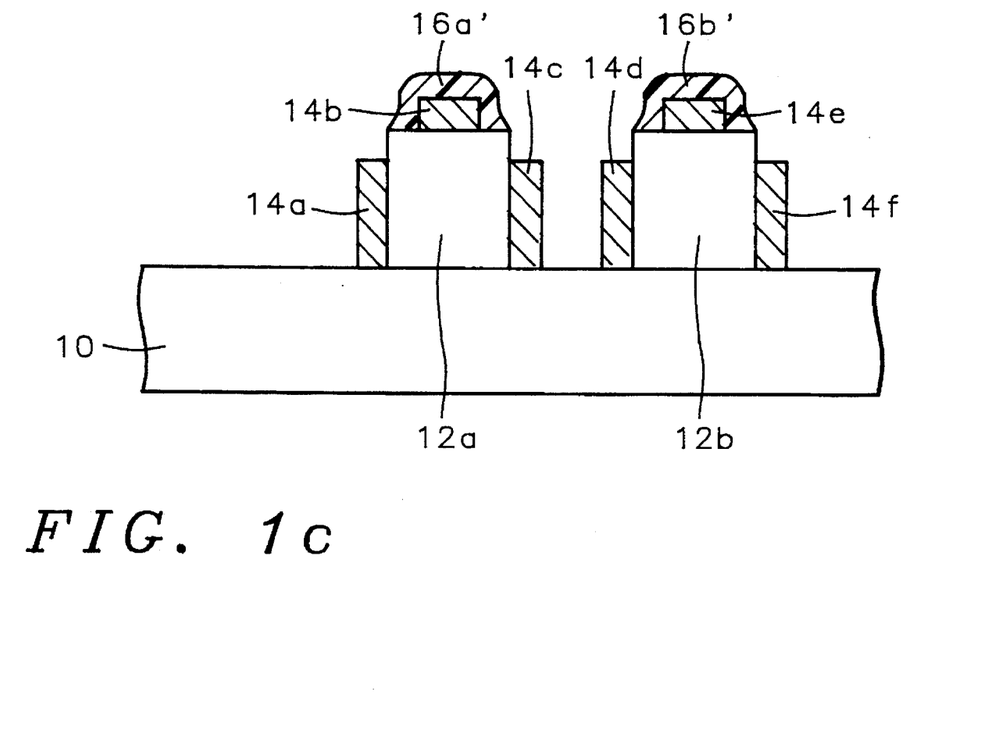

Referring now to FIG. 1c there is shown a cross-sectional schematic diagram which illustrates the results of the next process step in the first preferred embodiment of the present invention. Shown in FIG. 1c is the reflowing of the patterned photoresist layers 16a and 16b to form the reflowed patterned photoresist layers 16a' and 16b'. It is important to the present invention that the reflowed patterned photoresist layers 16a' and 16b' be sufficiently reflowed to cover the edges of the patterned conductor layers 14b and 14e, respectively. The process conditions under which the reflowing of patterned photoresist layers 16a and 16b is accomplished will vary depending upon parameters including but not limited to the chemical composition of the patterned photoresist layers 16a and 16b, the thickness of the patterned photoresist layers 16a and 16b, and the thickness of the patterned conductor layers 14b and 14e. Typically, the patterned photoresist layers 16a and 16b will be reflowed at a temperature of about 150 to about 250 degrees centigrade.

Figure 1D:
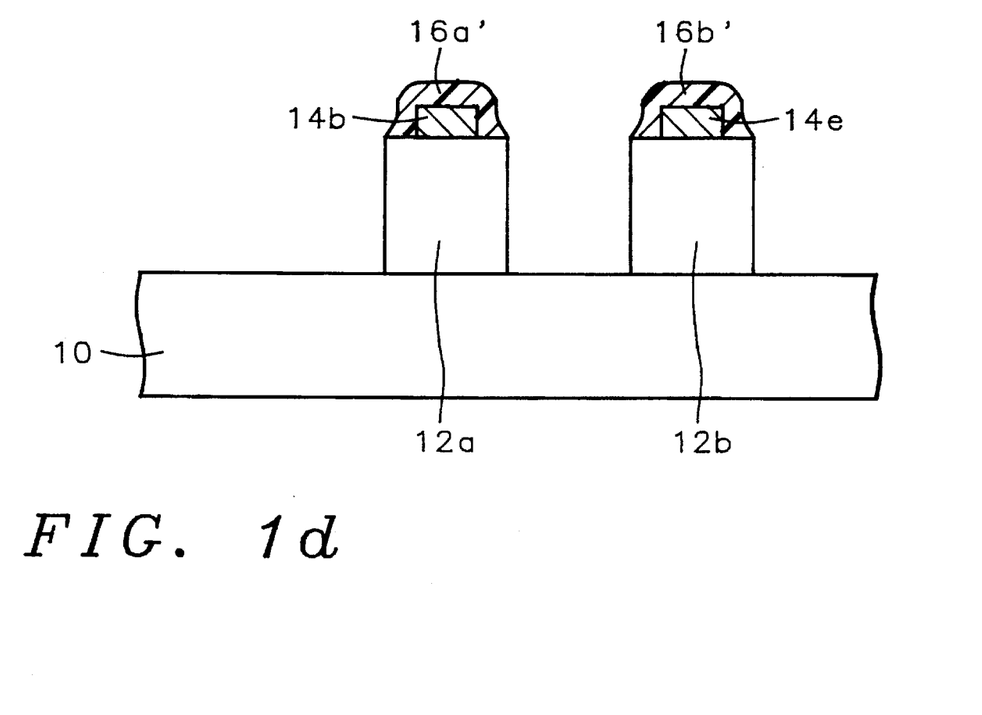

Referring now to FIG. 1d, there is shown a cross-sectional schematic diagram illustrating the results of the next process step in forming the first preferred embodiment of the present invention. Shown in FIG. 1d is the removal of the conductor layer residues 14a, 14c, 14d and 14f from the sidewalls of the high step height patterned integrated circuit layers 12a and 12b. The removal of the conductor layer residues 14a, 14c, 14d and 14f is accomplished through an isotropic etch process. Isotropic etch processes are typically, although not exclusively wet chemical etch processes which possess excellent permeability into intricate semiconductor features. For the first preferred embodiment of the present invention, the isotropic etch process is a wet chemical etch process appropriate to the composition of the conductor layer residues 14a, 14c, 14d and 14f. However, for semiconductor features in the sub-micron range a highly selective isotropic plasma etch is also desirable.

Figure 1E:
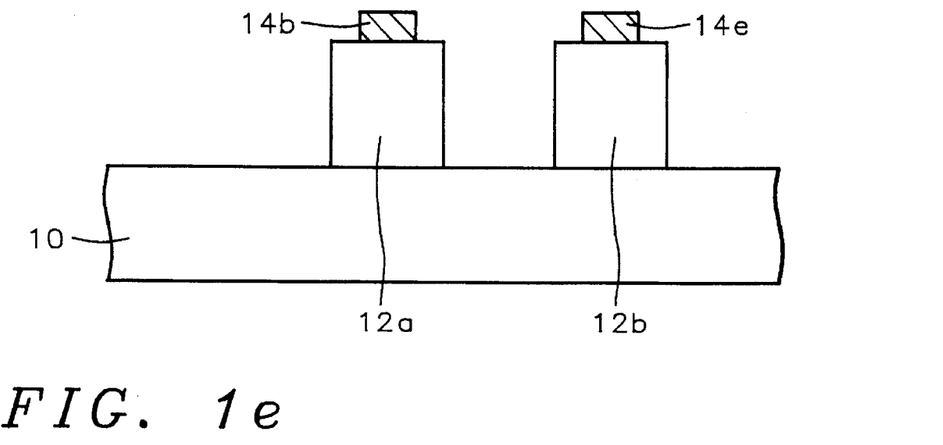

Referring now to FIG. 1e, there is shown a cross-sectional schematic diagram which illustrates the last process step in the first preferred embodiment of the present invention. Shown in FIG. 1e is the removal of the reflowed patterned photoresist layers 16a' and 16b'. Methods through which reflowed patterned photoresist layers may be removed are known in the art. Such methods include but are not limited to wet chemical etch methods employing suitable solvents and dry plasma etch methods typically employing oxygen containing plasmas. For the first preferred embodiment of the present invention, the reflowed patterned photoresist layers 16a' and 16b' are preferably removed through a dry plasma etch process employing an oxygen containing plasma, as is common in the art.

Upon removing the reflowed patterned photoresist layers 16a' and 16b' there is formed the residue free patterned conductor layers 14b and 14e of the first preferred embodiment of the present invention upon a high step height integrated circuit substrate formed of high step height patterned integrated circuit layers 12a and 12b. The conductor layer residues 14a, 14c, 14d and 14f have been removed from the lower step level sidewalls of the high step height patterned integrated circuit layers 12a and 12b while simultaneously preserving the integrity of the patterned conductor layers 14b and 14e.

Having illustrated the first preferred embodiment of the present invention which derives from the general integrated circuit structure where a patterned conductor layer is formed upon the surface of a high step height integrated circuit substrate, a second preferred embodiment of the present invention will also be disclosed. The second preferred embodiment of the present invention derives from a more specific integrated circuit structure where a patterned conductor layer is formed upon the surface of a high step height integrated circuit substrate which contains field effect transistors or other integrated circuit devices formed therein and there-upon. The upper surfaces of the field effect transistors or other integrated circuit devices form the high step within the high step height integrated circuit substrate of the second preferred embodiment of the present invention. Lower levels of the field effect transistors or other integrated circuit devices form the lower step levels of the high step height integrated circuit substrate of the second preferred embodiment of the present invention. The integrated circuit structure of the second preferred embodiment of the present invention is illustrated by reference to FIG. 2a to FIG. 2e.

Figure 2A:
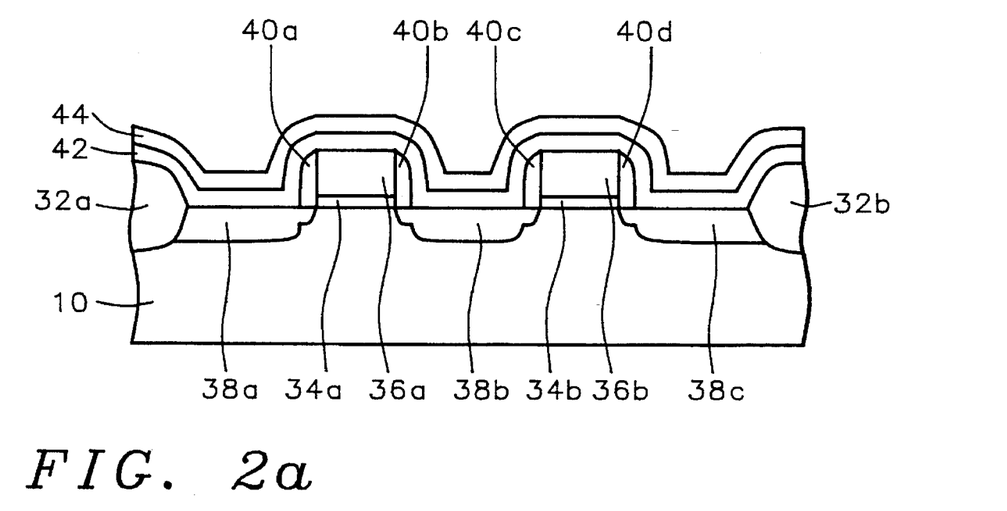
FIG. 2a to FIG. 2e show a series of cross-sectional schematic diagrams which illustrate progressive stages in forming the residue free patterned conductor layer of the second preferred embodiment of the present invention.

FIG. 2a shows a semiconductor substrate 30 upon and within whose surface are formed isolation regions 32a and 32b which define the active region of the semiconductor substrate 30. Within the active region of the semiconductor substrate 30 is formed a pair of field effect transistors.

The semiconductor substrate 30 upon which is practiced the second preferred embodiment of the present invention may be formed with either dopant polarity, any dopant concentration and any crystallographic orientation. Typically, the semiconductor substrate 30 upon which is practiced the second preferred embodiment of the present invention is a (100) silicon semiconductor substrate of N− or P− polarity. In general, isolation regions within and/or upon semiconductor substrates may be formed through methods including but not limited to selective thermal oxidation methods and selective oxide deposition/patterning methods. For the second preferred embodiment of the present invention, the isolation regions 32a and 32b are preferably formed through thermal oxidation of portions of the semiconductor substrate 30 exposed through a suitable mask to form isolation regions 32a and 32b of silicon oxide.

The pair of field effect transistors formed within the active region of the semiconductor substrate 30 are comprised of gate oxides 34a and 34b upon which reside, respectively, gate electrodes 36a and 36b. In addition to the gate oxides 34a and 34b and the gate electrodes 36a and 36b, the pair of field effect transistors also include the source/drain electrodes 38a, 38b and 38c, and the insulator spacers 40a, 40b, 40c and 40d. The methods and materials through which all of the above noted field effect transistor components may be formed within or upon the semiconductor substrate 30 are conventional to the art.

For example, gate oxides may be formed through methods including but not limited to thermal oxidation methods whereby portions of semiconductor substrates are consumed to form gate oxides, and oxide deposition methods whereby gate oxides are formed from independently deposited and patterned gate oxide materials. Gate electrodes are typically but not exclusively formed via patterning through methods as are conventional in the art of blanket layers of highly conductive materials such as metals, metal alloys, highly doped polysilicon and polycides (metal silicide/polysilicon stacks). As is conventional in the art, source drain electrodes are typically formed through ion implanting suitable dopant species into the surface of a semiconductor substrate. Finally, insulator spacers are typically formed through anisotropic etching of blanket layers of insulator spacer materials formed upon semiconductor substrate surfaces. The insulator spacer materials include but are not limited to silicon oxide materials, silicon nitride materials and silicon oxynitride materials.

For the second preferred embodiment of the present invention, the gate oxide layers 34a and 34b are preferably formed to a thickness of about 40 to about 500 angstroms each through thermal oxidation of the surface of the semiconductor substrate 30. The gate electrodes 36a and 36b are preferably about 1000 to about 4000 angstroms thick each and preferably formed from either doped polysilicon or a polycide formed from alternating layers of polysilicon and tungsten silicide. The source/drain electrodes 38a, 38b and 38c are preferably formed of a low dose/low energy ion implant at about 1E13 to about 5E14 ions per square centimeter dose and about 20 to about 80 keV ion implant energy, followed by a high dose/high energy ion implant at about 5E14 to about 5E15 ions per square centimeter and about 30 to about 100 keV ion implantation energy. Between the low dose/low energy ion implant and the high dose/high energy ion implant there are formed the insulator spacers 40a, 40b, 40c and 40d, preferably through anisotropic Reactive Ion Etch (RIE) etching of a blanket layer of either a silicon oxide material or a silicon nitride material.

Also shown in FIG. 2a is the presence of two additional layers formed conformally upon the surfaces of the pair of field effect transistors. The first layer is a blanket conformal oxide layer 42 and the second layer is a blanket conformal conductor layer 44. Methods and materials through which blanket conformal oxide layers and blanket conformal conductor layers may be formed upon semiconductor substrates are known in the art. Blanket conformal oxide layers may be formed from silicon oxides or silicon oxynitrides formed upon a semiconductor substrate through methods including but not limited to Low Pressure Chemical Vapor Deposition (LPCVD) methods, Plasma Enhanced Chemical Vapor Deposition (PECVD) methods and Rapid Thermal Nitridation (RTN) (of silicon oxide) methods. Analogously, blanket conductor layers may be formed upon semiconductor substrates from conductor materials such as metals, metal alloys, doped polysilicon and polycides, through methods including but not limited to Chemical Vapor Deposition (CVD) methods, Plasma Enhanced Chemical Vapor Deposition (PECVD) methods and Physical Vapor Deposition (PVD) sputtering methods.

For the second preferred embodiment of the present invention, the blanket insulator layer 42 is preferably formed of a silicon oxide material deposited upon the surface of the semiconductor substrate 30 through a Plasma Enhanced Chemical Vapor Deposition (PECVD) method. Preferably, the thickness of the blanket insulator layer 42 is from about 200 to about 2000 angstroms. For the second preferred embodiment of the present invention, the blanket conductor layer 44 is preferably formed of a polysilicon or polycide (polysilicon/metal silicide stack) material deposited upon the surface of the semiconductor substrate 30 through a Chemical Vapor Deposition (CVD) process. Preferably, the polysilicon within the blanket conductor layer 44 is made conductive through ion implanting with about 5E14 to about 2E16 dopant atoms per square centimeter. Alternatively, the dopant atoms may be incorporated in-situ as the blanket conductor layer 44 is formed. Preferably, the thickness of the blanket conductor layer 44 is from about 200 to about 4000 angstroms.

Within the second preferred embodiment of the present invention, the high step height integrated circuit substrate is the top surface of the blanket insulator layer 42 over the surface of the gate electrode 36a or the gate electrode 36b. The lower step level of the high step height integrated circuit substrate is the surface of the blanket insulator layer 42 over the surface of the source/drain electrode 38b. Since the blanket insulator layer 42 is a conformal insulator layer, the step height for the second preferred embodiment of the present invention is approximately equal to the thickness of the gate electrode 36a or 36b plus the thickness of the gate oxide 34a or 34b, respectively. Thus, for the second preferred embodiment of the present invention the step height is from about 1000 to about 4500 angstroms.

Figure 2B:
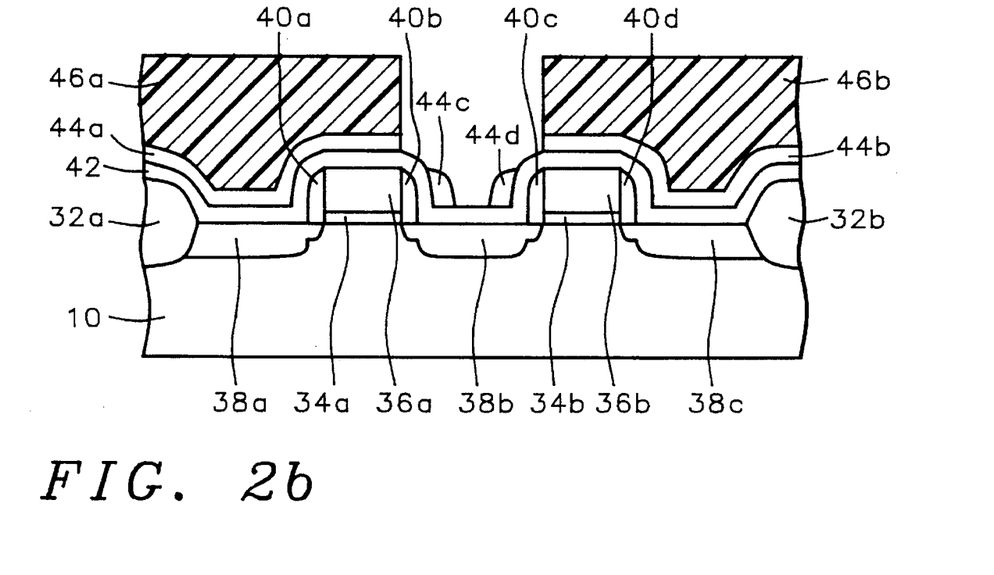

Referring now to FIG. 2b, there is shown a schematic cross-sectional diagram illustrating the next series of process steps in accord with the second preferred embodiment of the present invention. Shown in FIG. 2b is the presence of patterned photoresist layers 46a and 46b upon the surface of the semiconductor substrate illustrated in FIG. 2a. Analogously to the first preferred embodiment of the present invention, the patterned photoresist layers 46a and 46b may be formed from any of several photoresists including but not limited to novolak, Poly-Methyl-Meth-Acrylate (PMMA) and chemically amplifying photoresists Preferably, the photoresist layers 46a and 46b are formed from a novolak photoresist. Preferably, the patterned photoresist layers 46a and 46b are from about 4000 to about 30000 angstroms thick each.

As is shown in FIG. 2b, the blanket conductor layer 44 which resides beneath the patterned photoresist layers 46a and 46b has been patterned through an anisotropic etch process to yield the patterned conductor layers 44a and 44b. Although several anisotropic etch methods may be used in forming the patterned conductor layers 44a and 44b from the blanket conductor layer 44, for the second preferred embodiment of the present invention, the blanket conductor layer 44 is preferably etched to form the patterned conductor layers 44a and 44b through an anisotropic Reactive Ion Etch (RIE) etch process which employs a mixture of chlorine, hydrogen bromide and sulfur hexa-fluoride as the reactive etchant gasses. As illustrated in FIG. 2b, there remains after the Reactive Ion Etch (RIE) etch process the conductor layer residues 44c and 44d which result from incomplete etching of the blanket conductor layer 44 at locations where the blanket conductor layer 44 adjoins the high step height vertical sidewall regions of the insulator spacers 40b and 40c. It is towards removal of the conductor layer residues 44c and 44d without damaging the edges of the patterned conductor layers 44a and 44b exposed beneath the patterned photoresist layers 46a and 46b that the second preferred embodiment of the present invention is directed.

Figure 2C:
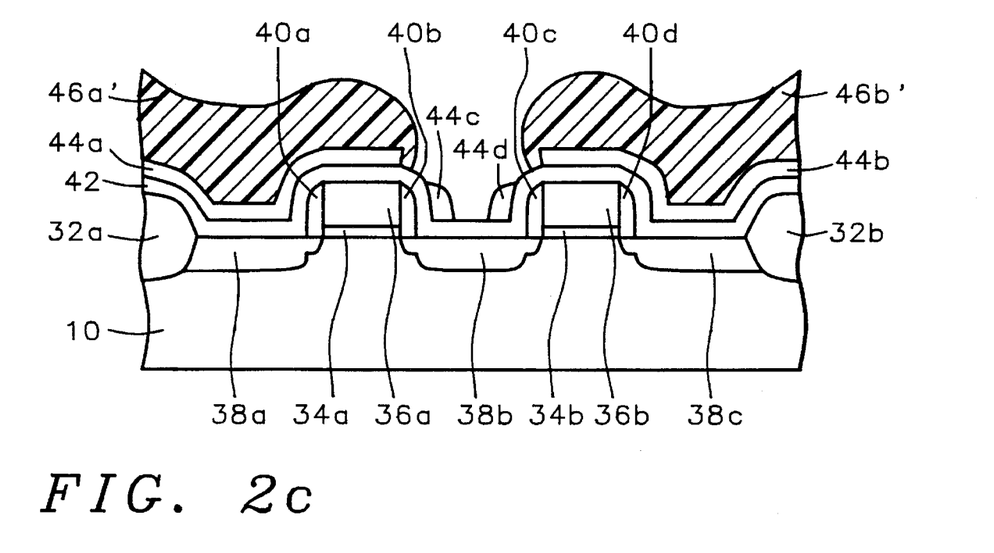

Referring now to FIG. 2c, there is shown a schematic cross-sectional diagram illustrating the results of the next process step in the second preferred embodiment of the present invention. Shown in FIG. 2c are the reflowed patterned photoresist layers 46a' and 46b' which have been formed through reflowing the patterned photoresist layers 46a and 46b. As illustrated in FIG. 2c, the reflowed patterned photoresist layers 46a' and 46b' have been reflowed sufficiently to cover the exposed edges of the patterned conductor layers 44a and 44b. Methods through which photoresist layers may be thermally reflowed are known in the art. Such methods include but are not limited to purely thermal methods, as well as optical methods by which light energy is absorbed by the photoresist layers and dissipated as heat energy. For the second preferred embodiment of the present invention, the patterned photoresist layers 46a and 46b are preferably reflowed to form the reflowed patterned photoresist layers 46a' and 46b' through a purely thermal process at a temperature of about 150 to about 250 degrees centigrade for a time period of about 5 to about 30 minutes.

Figure 2D:
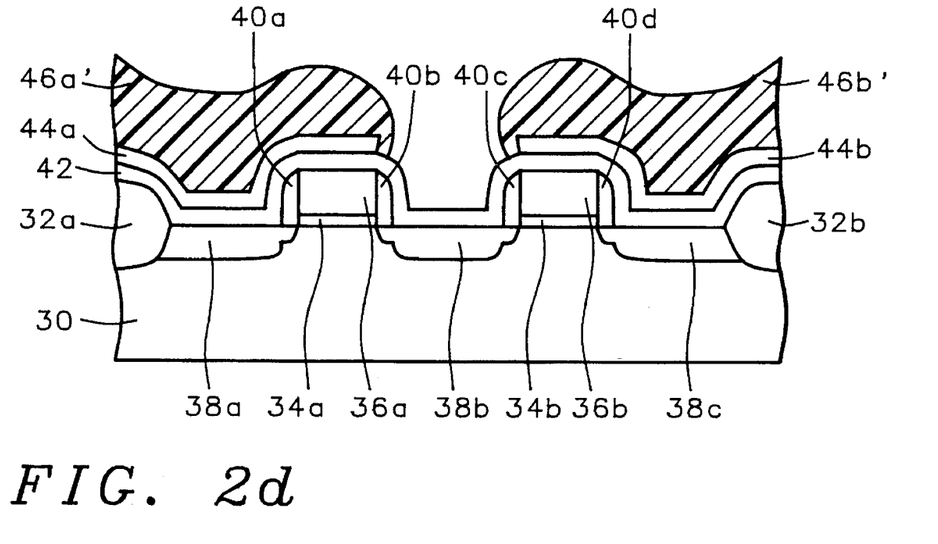

Referring now to FIG. 2d there is shown a schematic cross-sectional diagram illustrating the results of the next process step in the second preferred embodiment of the present invention. Shown in FIG. 2d is the removal of the conductor layer residues 44a and 44d from the aperture formed by the blanket insulator layer 42 and the reflowed patterned photoresist layers 46a' and 46b'. The conductor layer residues 44c and 44d are removed through an isotropic etch process. Isotropic etch processes are known in the art. Such processes include but are not limited to wet chemical etch processes and certain dry plasma etch processes. For the second preferred embodiment of the present invention, the isotropic etch process is preferably a wet chemical etch process employing a nitric acid:hydrofluoric acid:acetic acid:deionized water acid etch mixture at a concentration of about 40:2:1:20 to about 20:2:1:20.

Figure 2E:
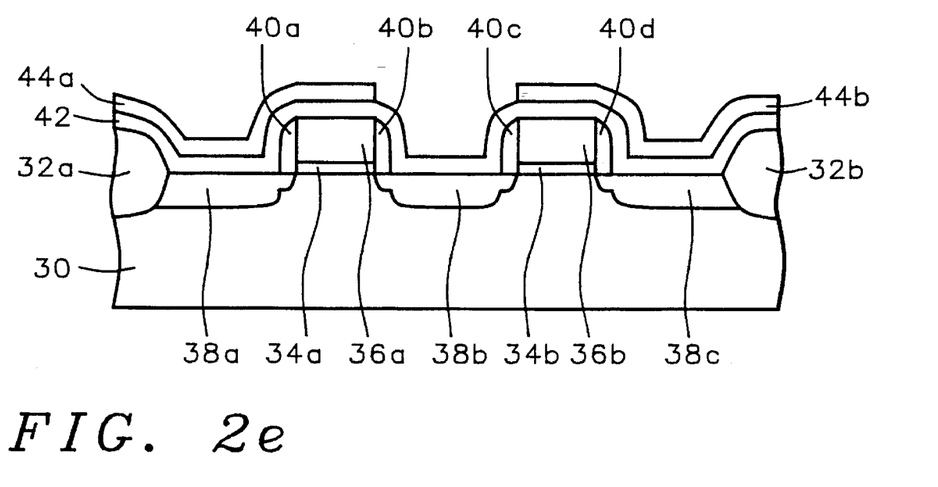

Referring now to FIG. 2e, there is shown a schematic cross-sectional diagram illustrating the last process step in the second preferred embodiment of the present invention. Shown in FIG. 2e is the integrated circuit structure as illustrated in FIG. 2d from which have been removed the reflowed patterned photoresist layers 46a' and 46b'. Methods and materials through which photoresist layers may be removed from semiconductor substrates are known in the art. Such methods include but are not limited to wet chemical etch methods which employ solvents or aqueous solutions appropriate to the photoresist material, and dry plasma etch methods which typically employ oxygen as the active material to assist in removal of photoresist residues. For the second preferred embodiment of the present invention, the reflowed patterned photoresist layers 46a' and 46b' are preferably removed from the surface of the semiconductor substrate through a dry plasma etch process employing oxygen, as is most common in the art.

Upon removing the reflowed patterned photoresist layers 46a' and 46b' to yield the semiconductor substrate illustrated in FIG. 2e, there is formed the residue free patterned conductor layers 44a and 44b of the second preferred embodiment of the present invention upon a high step height integrated circuit substrate having field effect transistors formed therein and there-upon. The conductor layer residues 44c and 44d have been removed from the lower step level sidewalls of the field effect transistor structures while simultaneously preserving the integrity of the patterned conductor layers 44a and 44b.

As is understood by a person skilled in the art, the preferred embodiments of the present invention are illustrative of the present invention and not limiting of the present invention. Revisions to the methods, materials and structures through which are formed the preferred embodiments of the present invention may be made while yielding embodiments which are within the spirit and scope of the present invention.

What is claimed is:

1. A method for forming a residue free patterned conductor layer upon a high step height integrated circuit substrate comprising:

providing a substrate layer having formed thereon a high step height patterned integrated circuit layer, the high step height patterned integrated circuit layer having a pair of sidewalls;

forming upon the high step height patterned integrated circuit layer a blanket conductor layer;

forming upon the blanket conductor layer a patterned photoresist layer;

patterning through the patterned photoresist layer the blanket conductor layer via an anisotropic etch process to yield a patterned conductor layer upon the surface of the high step height integrated circuit layer and conductor layer residues at a lower step level of the high step height integrated circuit layer;

reflowing the patterned photoresist layer to cover exposed edges of the patterned conductor layer; and removing through an isotropic etch process the conductor layer residues formed at the lower step level of the high step height integrated circuit layer.

2. The method of claim 1 wherein the step height of the high step height integrated circuit layer is at least 1000 angstroms.

3. The method of claim 1 wherein the sidewalls of the high step height patterned integrated circuit layer are formed without undercutting at an angle of about 85 to about 95 degrees with respect to the plane of the substrate layer.

4. The method of claim 1 wherein the blanket conductor layer is formed from a conductive material chosen from the group of conductive materials consisting of metals, metal alloys, metal silicides, metal nitrides, doped polysilicon and polycides (polysilicon/metal silicide stacks).

5. The method of claim 1 wherein the blanket conductor layer has a thickness of about 200 to about 4000 angstroms.

6. The method of claim 1 wherein the patterned photoresist layer is formed from a photoresist chosen from the group of photoresists consisting of novolak, Poly-Methyl-Meth-Acrylate (PMMA) and chemically amplifying photoresists.

7. The method of claim 1 wherein the patterned photoresist layer is from about 4000 to about 30000 angstroms thick.

8. The method of claim 1 wherein the patterned photoresist layer is reflowed at a temperature of about 150 to about 250 degrees centigrade.

9. A method for forming a residue free patterned conductor layer upon a high step height integrated circuit substrate comprising:

provid­ing a semiconductor substrate having formed therein and thereupon at least one integrated circuit device, the integrated circuit device having an upper surface which comprises a high step height and at least one lower surface which comprises a lower step level, the difference between the high step height and the lower step level being a step height;

forming upon the semiconductor substrate a blanket conductor layer;

forming upon the blanket conductor layer a patterned photoresist layer;

patterning through the patterned photoresist layer the blanket conductor layer via an anisotropic etch process to yield a patterned conductor layer upon the upper surface of the integrated circuit device, and conductor layer residues at the lower step level of the integrated circuit device;

reflowing the patterned photoresist layer to cover the exposed edges of the patterned conductor layer; and removing through an isotropic etch process the conductor layer residues formed at the lower step level of the integrated circuit device.

10. The method of claim 9 wherein the integrated circuit device is a field effect transistor.

11. The method of claim 9 wherein the step height is from about 1000 to about 4500 angstroms.

12. The method of claim 9 wherein the blanket conductor layer is formed from a material chosen from the group of materials consisting of polysilicon and polycide (polysilicon/metal silicide stack) materials.

13. The method of claim 12 wherein the thickness of the blanket conductor layer is from about 200 to about 4000 angstroms.

14. The method of claim 9 wherein the patterned photoresist layer is formed from a photoresist material chosen from the group of photoresist materials consisting of novolak, Poly-Methyl-Meth-Acrylate (PMMA) and chemically amplifying photoresists.

15. The method of claim 14 wherein the patterned photoresist layer is from about 4000 to about 30000 angstroms thick.

16. The method of claim 12 wherein the anisotropic etch process is a Reactive Ion Etch (RIE) plasma etch process employing a mixture of chlorine, hydrogen bromide and sulfur hexa-fluoride reactive etchant gasses.

17. The method of claim 14 wherein the patterned photoresist layer is reflowed through a purely thermal process at a temperature of about 150 to about 250 degrees centigrade for a time period of about 5 to about 30 minutes.

18. The method of claim 12 wherein the isotropic etch process is a wet chemical etch process employing a nitric acid:hydrofluoric acid:acetic acid:deionized water acid etch mixture at a concentration of about 40:2:1:20 to about 20:2:1:20.

* * * * *

UNITED STATES PATENT AND TRADEMARK OFFICE
CERTIFICATE OF CORRECTION

PATENT NO. : 5,618,384
DATED : April 8, 1997
INVENTOR(S) : Lap Chan
Mei Sheng Zhou It is certified that error appears in the above-indentified patent and that said Letters Patent is hereby corrected as shown below: Title page:

Item (75), correct Inventor's name from "Met S. Zhou" to --Mei S. Zhou--

Signed and Sealed this

Ninth Day of September, 1997

Attest:

BRUCE LEHMAN

Attesting Officer

Commissioner of Patents and Trademarks